United States Patent
White et al.

(10) Patent No.: US 10,483,423 B2
(45) Date of Patent: Nov. 19, 2019

(54) QUANTUM DOT PHOTODETECTOR APPARATUS AND ASSOCIATED METHODS

(71) Applicant: EMBERION OY, Espoo (FI)

(72) Inventors: Richard White, Huntingdon (GB); Alexander Bessonov, Cambridge (GB); Piers Andrew, Cambridge (GB); Mark Allen, Cambridge (GB); Elisabetta Spigone, Cambridge (GB); Michael Robert Astley, Waterbeach (GB)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 16/165,248

(22) Filed: Oct. 19, 2018

(65) Prior Publication Data
US 2019/0051786 A1    Feb. 14, 2019

Related U.S. Application Data

(63) Continuation-in-part of application No. PCT/FI2017/050409, filed on Jun. 1, 2017.

(30) Foreign Application Priority Data

Jun. 2, 2016 (EP) .................................. 16172680

(51) Int. Cl.
*H01L 31/112* (2006.01)
*H01L 31/0352* (2006.01)
(Continued)

(52) U.S. Cl.
CPC .. *H01L 31/1127* (2013.01); *H01L 31/035218* (2013.01); *H01L 31/113* (2013.01); *H01L 31/18* (2013.01)

(58) Field of Classification Search
CPC ................. H01L 31/1127; H01L 31/18; H01L 31/035218; H01L 31/113
See application file for complete search history.

(56) References Cited

U.S. PATENT DOCUMENTS 7,706,220 B2    4/2010   Kawamura et al.
9,735,236 B2 *  8/2017   Jain ...................... H01L 29/158
(Continued)

OTHER PUBLICATIONS

International Search Report & Written Opinion dated Nov. 15, 2017 corresponding to International Patent Application No. PCT/FI2017/050409.

(Continued)

*Primary Examiner* — David Vu
(74) *Attorney, Agent, or Firm* — Squire Patton Boggs (US) LLP

(57) ABSTRACT

An apparatus comprises a layer of channel material, source and drain electrodes configured to enable a flow of electrical current through the channel material, and a layer of quantum dot material configured to generate electron-hole pairs on exposure to electromagnetic radiation to produce a detectable change in the electrical current indicative of one or more of the presence and magnitude of the electromagnetic radiation. The layer of quantum dot material is positioned between the channel material and a layer of conductive material. The layers of channel and conductive material have work functions such that respective built-in electric fields are created at the interfaces between the layer of quantum dot material and the channel and conductive material. The electric field at each interface acts in the same direction to promote separation of the electrons and holes of the electron-hole pairs to facilitate production of the detectable change in electrical current.

15 Claims, 8 Drawing Sheets

(51) Int. Cl.
  *H01L 31/113* (2006.01)
  *H01L 31/18* (2006.01)

(56) References Cited

U.S. PATENT DOCUMENTS

| | | |
|---|---|---|
| 2012/0056076 A1 | 3/2012 | Tian et al. |
| 2013/0032782 A1 | 2/2013 | Gerasimos et al. |
| 2014/0299741 A1 | 10/2014 | Colli |
| 2015/0243826 A1* | 8/2015 | An .................. H01L 31/028 250/200 |
| 2015/0364545 A1 | 12/2015 | Heo et al. |

OTHER PUBLICATIONS

Valerio Adinolfi et al., "Photojunction Field-Effect Transistor Based on a Colloidal Quantum Dot Absorber Channel Layer," In: ACS Nano American Chemical Society, vol. 9, No. 1, Jan. 5, 2015, pp. 356-362.

Gerasimos Konstantatos et al., "Solution-Processed Quantum Dot Photodetectors," Proceedings of the IEEE, vol. 97, No. 10, Oct. 1, 2009, pp. 1666-1683.

Eric J. Gansen et al., "Single-photon detection using a semiconductor quantum dot, optically gated, field-effect transistor," 2006 Conference on Lasers and Electro-Optics and 2006 Quantum Electronics and Laser Science Conference, IEEE, May 2006.

\* cited by examiner

Inductive grid

Capacitive grid

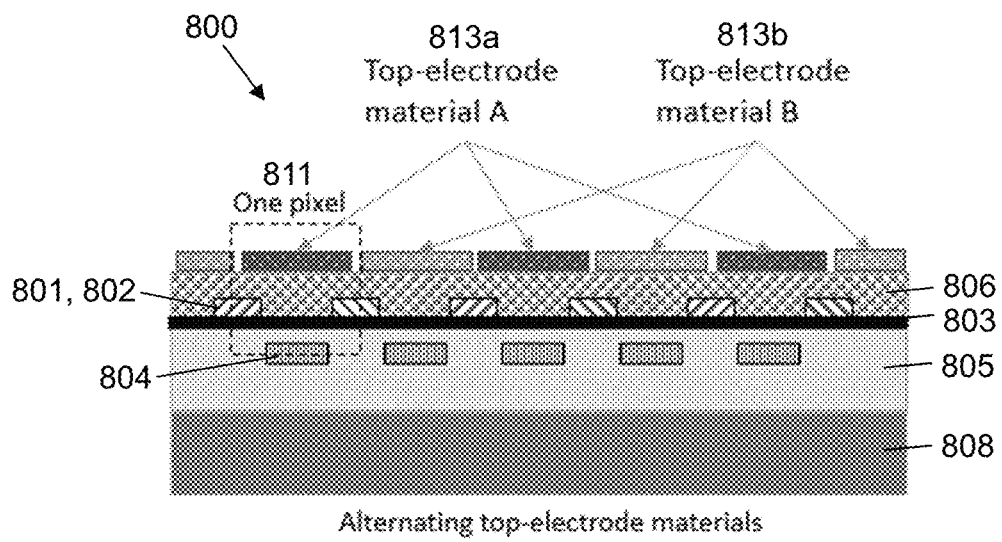
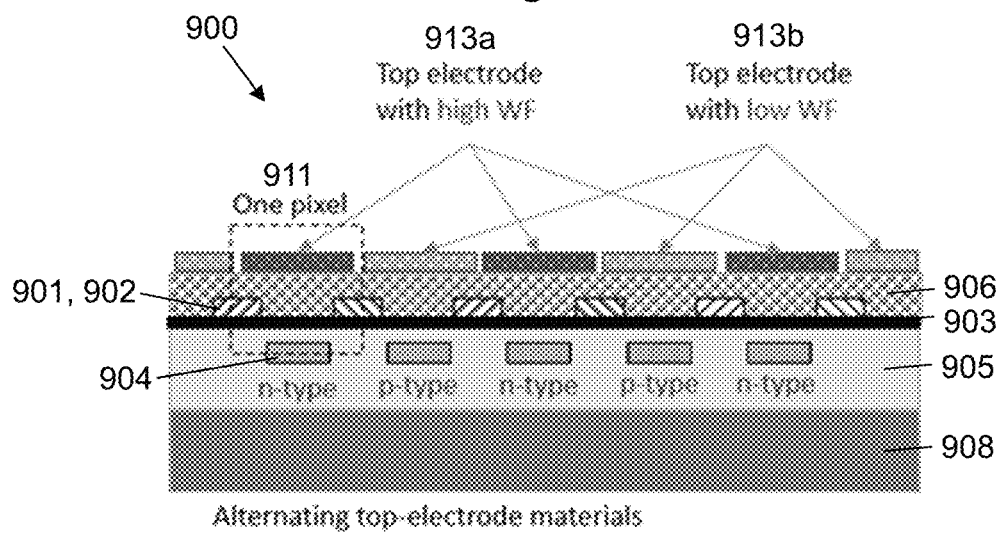

QUANTUM DOT PHOTODETECTOR APPARATUS AND ASSOCIATED METHODS

CROSS REFERENCE TO RELATED APPLICATION

This is a Continuation-in-Part of International Patent Application No. PCT/FI2017/050409 filed Jun. 1, 2017, which designates the U.S. and was published under PCT Article 21(2) in English, and which claims priority from European Patent Application No. 16172680.7, dated Jun. 2, 2016. The contents of these applications are hereby incorporated by reference.

TECHNICAL FIELD

The present disclosure relates particularly to photodetectors, associated methods and apparatus. Certain embodiments specifically concern an apparatus comprising a layer of quantum dot material positioned between layers of channel and conductive material having work functions such that respective built-in electric fields are created at the interfaces between the layer of quantum dot material and the layers of channel and conductive material. In these embodiments, the built-in electrical fields at each interface act in the same direction to promote separation of the electrons and holes of electron-hole pairs generated on exposure of the quantum dot material to incident electromagnetic radiation to facilitate production of a detectable change in electrical current which is indicative of one or more of the presence and magnitude of the incident electromagnetic radiation.

Some embodiments may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs. The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new photodetector devices.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising a layer of channel material, source and drain electrodes configured to enable a flow of electrical current through the layer of channel material, and a layer of quantum dot material configured to generate electron-hole pairs on exposure to incident electromagnetic radiation to produce a detectable change in the electrical current which is indicative of one or more of the presence and magnitude of the electromagnetic radiation, wherein the layer of quantum dot material is positioned between the layer of channel material and a layer of conductive material, and wherein the layers of channel and conductive material have work functions such that respective built-in electric fields are created at the interfaces between the layer of quantum dot material and the layers of channel and conductive material, the built-in electric field at each interface acting in the same direction to promote separation of the electrons and holes of the generated electron-hole pairs to facilitate production of the detectable change in electrical current.

Each built-in electric field may extend across a depletion region of the respective interface, and the layer of quantum dot material may have a thickness of no more than the combined widths of the depletion regions such that an electric field is present throughout the thickness of the quantum dot layer.

The layer of conductive material may be configured to be substantially transparent to the incident electromagnetic radiation to enable exposure of the layer of quantum dot material through the layer of conductive material.

In any embodiment presented in this disclosure, the layer of conductive material may be a floating electrode. In other words, the layer of conductive material may be an electrode which is not set to any specific electric potential when the device is in use. Instead, the floating electrode formed by the layer of conductive material may be allowed to obtain any electric potential which the surrounding components impose upon it.

The apparatus may comprise a substrate configured to support the electrodes and layers of channel, quantum dot and conductive material, and the substrate and layer of channel material may be configured to be substantially transparent to the incident electromagnetic radiation to enable exposure of the layer of quantum dot material through the substrate and layer of channel material.

The layer of conductive material may be configured to be substantially transparent to a predefined range of wavelengths of electromagnetic radiation and substantially opaque to wavelengths outside of this predefined range.

The layer of conductive material may comprise a mesh having a periodicity configured to define the range of wavelengths.

The mesh may form one or more of an inductive grid and a capacitive grid.

The apparatus may comprise a plurality of pixels each comprising respective source and drain electrodes and layers of channel, quantum dot and conductive material, a first subset of the plurality of pixels may comprise a conductive material having a first work function, and a second subset of the plurality of pixels may comprise a conductive material having a second work function.

Each pixel may comprise a gate electrode configured to generate an electric field upon the application of a voltage thereto, and the voltage applied to the gate electrode of the first subset of the plurality of pixels may be different to the voltage applied to the gate electrode of the second subset of the plurality of pixels such that upon exposure to the incident electromagnetic radiation, the first and second subsets produce an increase and decrease in electrical current, respectively.

The first and second subsets of the plurality of pixels may be arranged such that the combined change in electrical current is converted into a corresponding voltage signal.

The first and second subsets of the plurality of pixels may be arranged to form a half-bridge circuit configured to convert the combined change in electrical current into a single-ended voltage signal.

The first and second subsets of the plurality of pixels may be arranged to form a full-bridge circuit configured to convert the combined change in electrical current into a differential voltage signal.

The layer of quantum dot material may comprise one or more of an inorganic atomic passivant and an additional light-sensitive material configured to increase the charge carrier mobility of the layer of quantum dot material.

The additional light-sensitive material may be a hybrid halide perovskite of the general formula $ABX_3$, where A is $CH_3NH_3$ or $NH_2CH=NH_2$, B is Pb or Sn, and X is Cl, Br or I.

The inorganic atomic passivant may comprise one or more of chloride ions, bromide ions, iodide ions, ammonium sulphide and sodium sulphide.

The layer of conductive material may comprise a chemical dopant configured to vary the work function of the layer of conductive material.

The layer of conductive material may comprise graphene, and the chemical dopant may comprise an n-type dopant.

The n-type dopant may comprise one or more of 1,5-naphthalenediamine; 9,10-dimethylanthracene; 9,10-dibromoanthracene; tetrasodium 1,3,6,8-pyrenetetrasulfonic acid; hydrazine; hydrazine monohydrate solution; n-phenyl-bis(trifluoromethane sulfonyl)imide; silver bis(trifluoromethane sulfonyl)imide; bis(trifluoromethanesulfonyl)amine; rubidium carbonate; caesium carbonate; and ammonia.

The apparatus may comprise an interfacial material at the interface between the layers of quantum dot and conductive material configured to introduce an electric dipole to vary the work function of the layer of conductive material.

The interfacial material may comprise one or more of lithium fluoride, a silane, a carboxylic acid and a phosphonic acid.

The respective lateral dimensions of the layers of quantum dot and conductive material may be configured such that the layer of quantum dot material prevents physical contact between the layer of conductive material and one or more of the source and drain electrodes.

The layer of conductive material may be configured to encapsulate the electrodes and layers of channel and quantum dot material to prevent exposure thereof to the surrounding environment.

The layer of conductive material may have a different (e.g. higher or lower) work function than the layer of channel material.

The layer of conductive material may comprise one or more of a transparent conductive oxide, a metal, metal nanowires, graphene, carbon nanotubes and a conductive polymer.

The transparent conductive oxide may comprise one or more of aluminium-doped zinc oxide, indium tin oxide, antimony-doped tin oxide and indium oxide.

The layer of channel material may comprise one or more of a semiconductor and a semi-metal.

The layer of channel material may comprise one or more of graphene, reduced graphene oxide, a graphene-like material, a transition metal dichalcogenide and another two-dimensional material.

The graphene-like material may comprise one or more of phosphorene, silicene, germanene, stanene, GaN, InN, InP, InAs, BAs, GaP, and BP.

The transition metal dichalcogenide may comprise one or more of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$, where X=O, S, Se or Te.

The layer of quantum dot material may comprise an n-type semiconducting material or a p-type semiconducting material.

The layer of quantum dot material may comprise one or more of PbS, CdSe, CdS, PbSe, ZnO, ZnS, CZTS, $Cu_2S$, $Bi_2S_3$, $Ag_2S$, $Ag_2Se$, HgTe, CdHgTe, InAs, InSb, Ge and ClS.

The layer of quantum dot material may, for example, comprise semiconductor nanocrystals or colloidal quantum dots selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, ClS, InAs, InSb, Ge, Si, graphene, or core/shell nanocrystals with any of the preceding core/shell constituents.

Alternatively, the quantum dot material may comprise any of the preceding semiconductor nanocrystals or colloidal quantum dots embedded in a host material comprising metal chalcogenide, metal halide, or hybrid halide perovskite. The metal chalcogenide may have the general formula $ME_n$, where E is S, Se or Te, and it may for example be $AsS_x$, CdS, CdSe, CdTe, $CuInS_2$, $SnS_x$, $In_2Se$ or $Bi_2Te_3$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CH_3NH_3$ or $NH_2CH=NH_2$, B is Pb or Sn, and X is Cl, Br or I.

The quantum dot loading in the host material may vary between 1% and 90%. The diameter of the semiconductor nanocrystals or quantum dots may, for example, be in the range 2-20 nm. The photosensitive semiconductor materials may provide substantial optical absorption in the wavelength range of 0.4-5 μm, defined by the optical bandgap of materials used.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

The source, drain and gate electrodes may comprise one or more of a metal, a metal nanoparticle ink, silver, gold, copper, nickel, cobalt, palladium, a conductive metal oxide, a carbon-based material, an organic material and a polymer.

The incident electromagnetic radiation may comprise one or more of visible light, infrared radiation, ultraviolet light and x-rays.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a photodetector, and a module for one or more of the same.

According to a further aspect, there is provided a method of detecting incident electromagnetic radiation using an apparatus, the apparatus comprising a layer of channel material, source and drain electrodes configured to enable a flow of electrical current through the layer of channel material, and a layer of quantum dot material configured to generate electron-hole pairs on exposure to incident electromagnetic radiation to produce a detectable change in the electrical current which is indicative of one or more of the presence and magnitude of the electromagnetic radiation, wherein the layer of quantum dot material is positioned between the layer of channel material and a layer of conductive material, and wherein the layers of channel and conductive material have work functions such that respective built-in electric fields are created at the interfaces between the layer of quantum dot material and the layers of channel and conductive material, the built-in electric field at each interface acting in the same direction to promote separation of the electrons and holes of the generated electron-hole pairs to facilitate production of the detectable change in electrical current, the method comprising determining one or more of the presence and magnitude of the incident electromagnetic radiation based on a detected change in the flow of electrical current through the layer of channel material.

According to a further aspect, there is provided a method of making an apparatus, the method comprising:

forming a layer of channel material;

forming source and drain electrodes configured to enable a flow of electrical current through the layer of channel material;

forming a layer of quantum dot material on top of the layer of channel material configured to generate electron-hole pairs on exposure to incident electromagnetic radiation to produce a detectable change in the electrical current which is indicative of one or more of the presence and magnitude of the electromagnetic radiation; and forming a layer of conductive material on top of the layer of quantum dot material such that the layer of quantum dot material is positioned between the layer of channel material and the layer of conductive material, the layers of channel and conductive material having work functions such that respective built-in electric fields are created at the interfaces between the layer of quantum dot material and the layers of channel and conductive material, the built-in electric field at each interface acting in the same direction to promote separation of the electrons and holes of the generated electron-hole pairs to facilitate production of the detectable change in electrical current.

The steps of any method disclosed herein do not have to be performed in the exact order disclosed, unless explicitly stated or understood by the skilled person.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:

FIG. 8 shows a photodetector apparatus comprising first and second subsets of pixels in which the layers of conductive material have different work functions;

FIG. 9 shows a photodetector apparatus comprising first and second subsets of pixels having oppositely biased gate electrodes;

DESCRIPTION OF SPECIFIC ASPECTS/EMBODIMENTS

Figure 1:
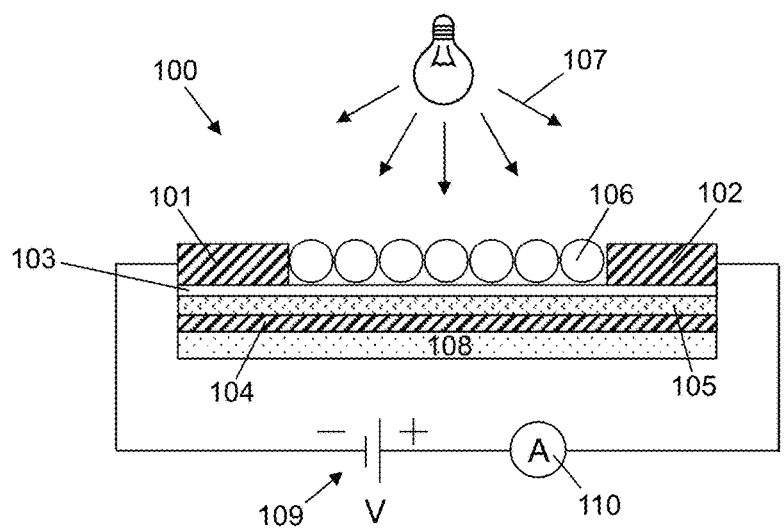
FIG. 1 shows a photodetector apparatus comprising a quantum dot field-effect transistor.

FIG. 1 shows a photodetector apparatus 100 comprising a quantum dot field-effect transistor. Field-effect transistors normally comprise source 101 and drain 102 electrodes configured to enable a flow of electrical current through a channel 103 between the source 101 and drain 102 electrodes, and a gate electrode 104 which is separated from the channel 103 by a dielectric material 105 and is configured to vary the electrical current flowing through the channel 103 when a voltage is applied thereto. To enable photodetection, however, the gate electrode 104 is replaced (or supplemented) by a plurality of quantum dots 106 configured to cause a detectable change in the electrical current on exposure to incident electromagnetic radiation 107 which is indicative of one or more of the presence and magnitude of the incident electromagnetic radiation 107.

The quantum dots 106 are formed on top of the channel 103, which itself is supported on a substrate 108. The quantum dots 106 are configured to generate electron-hole pairs on exposure to the incident electromagnetic radiation 107. The photodetector apparatus 100 is configured such that, after the generation of these electron-hole pairs, either the electrons or the holes are transferred to the channel 103 leaving the remaining charge carriers on the quantum dots 106. These remaining charge carriers then gate the channel 103 causing a detectable change in the current flowing therethrough.

The photodetector apparatus 100 also comprises a power supply 109 configured to apply a potential difference V between the source 101 and drain 102 electrodes, and an ammeter 110 configured to measure the electrical current flowing through the channel 103.

Figure 2:
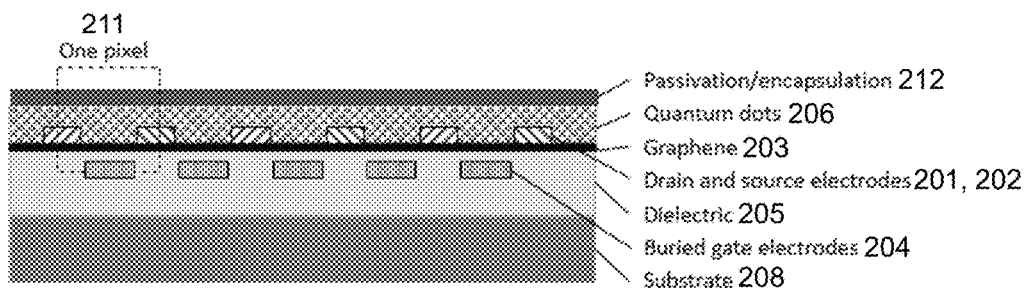
FIG. 2 shows a photodetector apparatus comprising a plurality of quantum dot field-effect transistors.

FIG. 2 shows a photodetector apparatus 200 comprising a plurality of quantum dot field-effect transistors. In this example, each quantum dot field-effect transistor forms a respective pixel 211 of an array. Furthermore, the various layers of material used to form the photodetector apparatus 200 are shared between multiple pixels 211. For example, all pixels 211 in this example share a common substrate 208, gate dielectric 205, channel layer 203, quantum dot layer 206 and passivation layer 212. In addition, each pixel 211 shares a source 201 and/or drain 202 electrode with an adjacent pixel 211. The sharing of material layers between different pixels 211 reduces the cost and complexity associated with fabrication of the photodetector apparatus 200 (but is not essential).

Photodetectors comprising quantum dot field-effect transistors typically exhibit excellent responsivity to the incident electromagnetic radiation. However, the responsivity has been found to be dependent upon the intensity of the incident electromagnetic radiation (the number of photo-generated charge carriers is limited at increasing intensities) as well as the thickness of the quantum dot layer.

Figure 3:
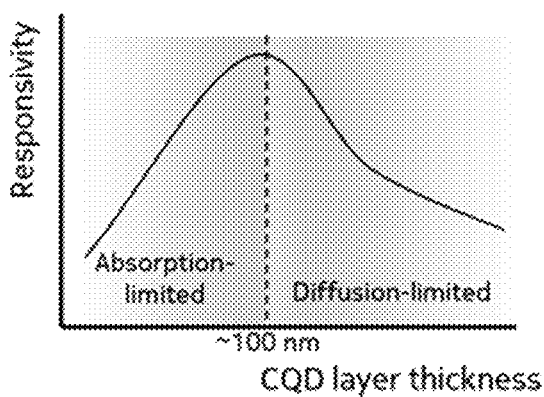
FIG. 3 shows how the responsivity of a quantum dot field-effect transistor varies with the thickness of the quantum dot layer.

FIG. 3 shows how the responsivity of a quantum dot photodetector apparatus varies with the thickness of the layer of (colloidal) quantum dots, CQDs. As the thickness decreases, the layer of quantum dots becomes less efficient at absorbing the incident electromagnetic radiation (i.e. it is absorption limited). As the thickness increases, the distance that the generated charge carriers have to travel to reach the layer of channel material also increases resulting in a greater probability of charge recombination (i.e. it is diffusion limited). Furthermore, the depletion region formed at the interface between the layers of channel and quantum dot material only extends a finite distance into the quantum dot layer. As a result, the built-in electric field associated with the depletion region has no effect at thicknesses greater than the depletion width.

The optimum thickness of the quantum dot layer depends upon the dynamics of the charge carriers (which is itself dependent upon the specific quantum dot material), the surface states of the quantum dots, and the ligands attached thereto. In the case of lead sulphide quantum dots with ethanedithiol ligands (for example), the optimal thickness of the layer of quantum dot material is around 100 nm, as indicated in FIG. 3.

Also, as mentioned above, the operation of a quantum dot field-effect transistor requires a net charge in the quantum dot layer after the photon is absorbed in order to vary the electrical current flowing through the channel. This net charge then remains in the quantum dot layer until the electrons and holes recombine, at which point the quantum dot layer has "recovered" and is ready to receive the next photon. The speed of response to the incident electromagnetic radiation is dependent upon the charge carrier mobility within the quantum dot layer and the charge transfer rate from the quantum dot layer to the channel. The speed of recovery is also dependent upon the charge carrier mobility within the quantum dot layer, as well as the lifetime of the net charge and the presence of charge traps within the system (such as water molecules at the interface between the channel and substrate).

There will now be described an apparatus and associated methods that may improve the responsivity and speed of photodetectors.

Figure 4:
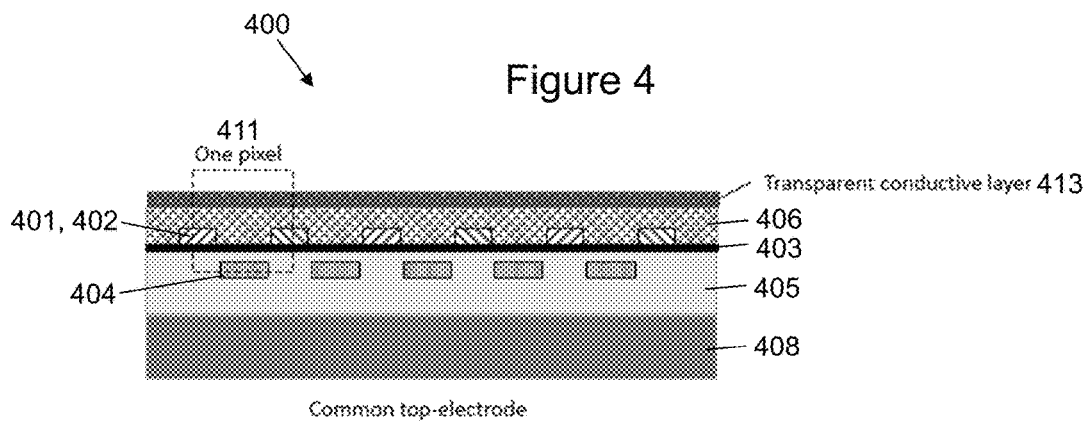
FIG. 4 shows a photodetector apparatus comprising a layer of conductive material on top of the layer of quantum dot material.

FIG. 4 shows one example of a photodetector apparatus 400. The apparatus 400 comprises the various components described with reference to FIG. 2 except for the passivation layer 212, which in this example is replaced by a layer of conductive material 413. The layer of quantum dot material 406 is positioned between the layer of channel material 403 and the layer of conductive material 413, the layers of channel 403 and conductive 413 material having work functions such that respective built-in electric fields are created at the interfaces between the layer of quantum dot material 406 and the layers of channel 403 and conductive 413 material. As mentioned above, the layer of conductive material 413 may be an electrically floating electrode which is not set to a specific electric potential when the device is in use. This means that the layer of conductive material 413 does not necessarily have to be connected to a voltage source. This also applies to the top electrodes 613, 713, 813a, 813b, 913a and 913b in FIGS. 6, 7a, 8 and 9, below.

Figure 5A:
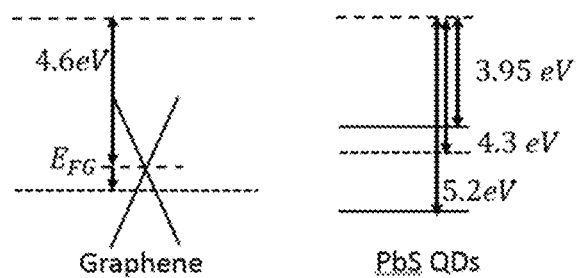
FIG. 5a shows the respective energy levels for graphene and lead sulphide quantum dots.

FIG. 5a is a band diagram showing the respective energy levels of p-doped graphene (which may be used to form the layer of channel material 403) and lead sulphide quantum dots with ethanedithiol ligands (which may be used to form the layer of quantum dot material 406). The term $E_{FG}$ denotes the graphene Fermi level relative to the charge neutrality point. The work function in the p-doped graphene is 4.6 eV before contact, while the work function in the PbS quantum dots is 4.3 eV before contact.

Figure 5B:
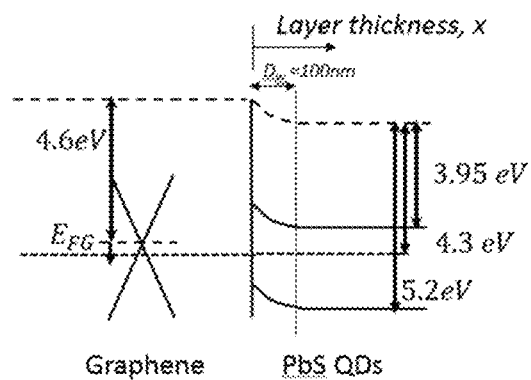
FIG. 5b shows the bending of the energy levels of FIG. 5a when the graphene and lead sulphide quantum dots are brought into contact with one another.

FIG. 5b shows how the energy levels of FIG. 5a change when the graphene and lead sulphide quantum dots are brought into contact with one another. On contact, holes are transferred from the graphene to the lead sulphide causing band bending at the interface therebetween. This creates a depletion region and associated built-in electric field at the interface which extends into the lead sulphide by a distance D, of around 100 nm (i.e. the depletion width). Similar to the depletion region of a p-n junction, the built-in electric field opposes further diffusion of charge in the absence of incident electromagnetic radiation. The work functions in the p-doped graphene layer and the PbS quantum dots may in some cases be slightly altered as the two layers make contact, but they have for simplicity been indicated as 4.6 eV and 4.3 eV also in FIG. 5b. Nevertheless, the direction of the built-in electric field will always be in the direction illustrated in FIG. 5b. In other words, contact may alter the magnitudes of the work functions, but not their internal order.

Figure 5C:
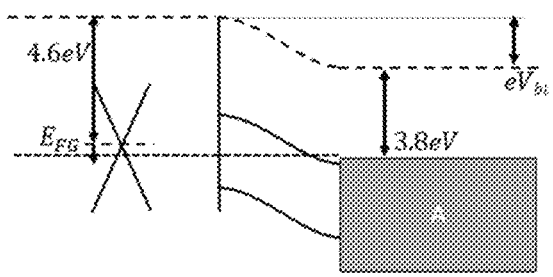
FIG. 5c shows the bending of the energy levels of FIG. 5a when the lead sulphide quantum dots are brought into contact with the graphene and a layer of conductive material.

FIG. 5c shows how the energy levels of FIG. 5a change when the lead sulphide quantum dots are brought into contact with both the graphene and a layer of conductive material denoted "A" (having a work function of 3.8 eV). When this heterostructure is formed, holes and electrons are transferred from the graphene and conductive material to the lead sulphide, respectively. This time, however, the band bending caused by the charge transfer not only creates a depletion region and associated built-in electric field at the interface between the lead sulphide and graphene, but also creates a depletion region and associated built-in electric field at the interface between the lead sulphide and conductive material.

In other words, the work function of the layer of channel material (in this case graphene) may be greater than the work function of the layer of quantum dot material. The work function of the layer of quantum dot material may be greater than the work function of the layer of conductive material.

Alternatively, the built-in electric fields may also be oriented in the opposite direction. The work function of the layer of channel material may be less than the work function of the layer of quantum dot material, and the work function of the layer of quantum dot material may be less than the work function of the layer of conductive material. The energy diagrams for this alternative have not been separately illustrated.

An estimation of the depletion widths (assuming no applied bias) can be calculated by:

$$D_w = \sqrt{\frac{2\varepsilon_0 \varepsilon_r V_{bi}}{q_e N}} \quad \text{Equation 1}$$

Where $V_{bi}$ is the initial built-in voltage associated with the built-in electric field and N is the charge density. If we take $\varepsilon_{PbS}=17\varepsilon_0$, N=5e16 cm$^{-3}$, $V_{bi}$ as 0.5 eV, then the depletion width at each interface of the lead sulphide is approximately 137 nm.

Once the built-in electric fields are established, the layer of quantum dot material can be exposed to incident electromagnetic radiation. The built-in electric fields promote separation of the electrons and holes of the photogenerated electron-hole pairs to facilitate production of a detectable change in the electrical current flowing through the layer of channel material. In the example described above, the photogenerated holes are transferred from the layer of quantum dot material 406 to the layer of channel material 403, and the photogenerated electrons are transferred from the layer of quantum dot material 406 to the layer of conductive material 413. The addition of photogenerated holes to the layer of channel material 403 increases the carrier density and conductivity of the channel material 403 causing a corresponding increase in electrical current. Furthermore, the build-up of electrons on the layer of conductive material 413 gates the layer of channel material 403 causing an increase in the flow of electrical current.

In practice, the layer of quantum dot material 406 should have a thickness of no more than the combined widths of the depletion regions. This helps to ensure that there is an electric field at all points within the quantum dot layer 406 to separate the electrons and holes of the photogenerated electron-hole pairs. That said, increasing the thickness of the quantum dot layer 406 to the point where there is an undepleted region at its centre would increase the total absorption of incident electromagnetic radiation (albeit with a lower extraction efficiency), so there is a trade-off.

Creating built-in electric fields at each interface of the quantum dot layer 406 allows thicker layers of quantum dot material 406 to be used. This is because electron-hole pairs generated outside of the depletion region at the interface between the layers of quantum dot 406 and channel 403 material can still be influenced by electrostatic drift. The use of thicker layers of quantum dot material 406 is advantageous because it allows a greater fraction of the incident electromagnetic radiation to be absorbed, thereby increasing the quantum efficiency of the photodetector apparatus 400.

It is expected that the build-up of photogenerated charge carriers on the layers of channel 403 and conductive 413 material will create an open-circuit voltage which opposes the built-in voltage $V_{bi}$ associated with the built-in electric fields. In this scenario, the efficient carrier separation provided by the built-in electric fields will be nullified when the open-circuit voltage is equal in magnitude to the built-in voltage $V_{bi}$. Nevertheless, since the density of electron states in the layer of conductive material 413 will typically be greater than the density of electron states in the layer of quantum dot material 406, the increase in electron energy when an electron is added to the layer of conductive material 413 (i.e. following photo absorption) is likely to be less than when an electron is added to the layer of quantum dot material 406 (i.e. during creation of the depletion region). A relatively large number of photogenerated electrons would therefore need to be transferred to the layer of conductive material 413 before the built-in voltage is nullified. As a result, the limit of responsivity may be assumed to be increased by the presence of the layer of conductive material 413.

It is important to note that the creation of depletion regions and built-in electric fields at the material interfaces of the heterostructure is dependent upon the work functions of the layers of channel 403 and conductive 413 material and is not limited to the specific materials mentioned above. The layer of channel material 403 may comprise one or more of graphene, reduced graphene oxide, a graphene-like material (e.g. phosphorene, silicene, germanene, stanene, GaN, InN, InP, InAs, BAs or GaP), and a transition metal dichalcogenide (e.g. WX$_2$, MoX$_2$, ScX$_2$, TiX$_2$, HfX$_2$, ZrX$_2$, VX$_2$, CrX$_2$, MnX$_2$, FeX$_2$, CoX$_2$, NiX$_2$, NbX$_2$, TcX$_2$, ReX$_2$, PdX$_2$ and PtX$_2$, where X=S, Se or Te). In addition, the layer of conductive material 413 may comprise one or more of a transparent conductive oxide (e.g. aluminium-doped zinc oxide, indium tin oxide, antimony-doped tin oxide or indium oxide), a metal, metal nanowires, graphene, carbon nanotubes and a conductive polymer.

Typically, the layer of conductive material 413 would have a different (e.g. higher or lower) work function than the layer of channel material 403 to enable sufficient separation of the electrons and holes of the generated electron-hole pairs. Whether the work function of the layer of conductive material 413 is higher or lower than the work function of the layer of channel material 403 depends on whether the Fermi energy of the layer of quantum dot material 406 is higher or lower than the work function of the layer of channel material 403. If the Fermi energy of the layer of quantum dot material 406 is lower than the work function of the layer of channel material 403, then the work function of the layer of conductive material 413 should be lower than the work function of the layer of channel material 403. On the other hand, if the Fermi energy of the layer of quantum dot material 406 is higher than the work function of the layer of channel material 403, then the work function of the layer of conductive material 413 should be higher than the work function of the layer of channel material 403.

Alternatively, whether the work function of the layer of conductive material 413 is higher or lower than the work function of the layer of channel material 403 depends on whether the work function of the layer of quantum dot material 406 is higher or lower than the work function of the layer of channel material 403. If the work function of the layer of quantum dot material 406 is lower than the work function of the layer of channel material 403, then the work function of the layer of conductive material 413 should be lower than the work function of the layer of quantum dot material 406. On the other hand, if the work function of the layer of quantum dot material 406 is higher than the work function of the layer of channel material 403, then the work function of the layer of conductive material 413 should be higher than the work function of the layer of quantum dot material 406.

In some cases, the layer of conductive material 413 may comprise a chemical dopant configured to vary (tune) its work function. For example, if the layer of conductive material 413 comprises graphene, the chemical dopant may be an n-type dopant such as 1,5-naphthalenediamine; 9,10-dimethylanthracene; 9,10-dibromoanthracene; tetrasodium 1,3,6,8-pyrenetetrasulfonic acid; hydrazine; hydrazine monohydrate solution; n-phenyl-bis(trifluoromethane sulfonyl)imide; silver bis(trifluoromethane sulfonyl)imide; bis(trifluoromethanesulfonyl)amine; rubidium carbonate; caesium carbonate; and ammonia. Additionally or alternatively, the apparatus 400 may comprise an interfacial material (e.g. lithium fluoride, a silane, a carboxylic acid or a phosphonic acid) at the interface between the layers of quantum dot 406 and conductive 413 material configured to introduce an electric dipole to vary the work function of the layer of conductive material 413.

The layer of quantum dot material 406 is also not limited to the example described above. The layer of quantum dot material 406 may comprise an n-type semiconducting material or a p-type semiconducting material. For example, the layer of quantum dot material 406 may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

In terms of suitable materials, the electrodes 401, 402, 404 may comprise one or more of a metal, a metal nanoparticle ink, silver, gold, copper, nickel, cobalt, palladium, a conductive metal oxide, a carbon-based material, an organic material and a polymer.

In some examples, the layer of conductive material 413 may be configured to be substantially transparent to the incident electromagnetic radiation to enable exposure of the layer of quantum dot material 406 through the layer of conductive material 413. The need for transparency, however, limits the number of materials (and hence work functions) for tuning the built-in voltage.

Figure 6:
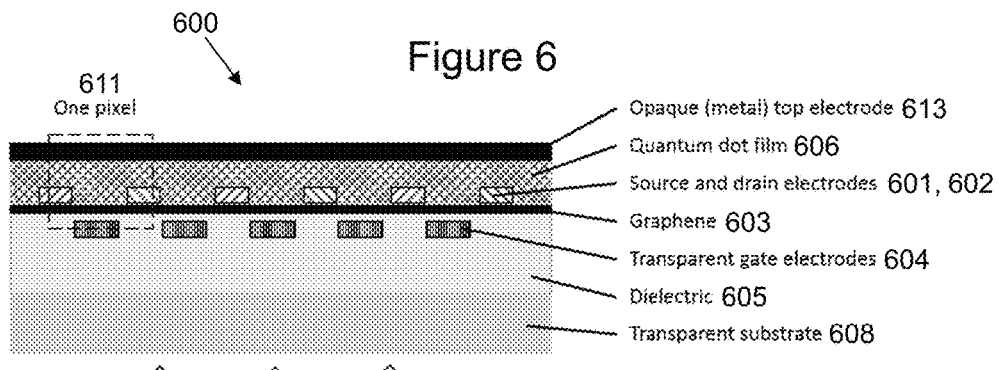
FIG. 6 shows a photodetector apparatus comprising transparent materials configured to enable exposure of the quantum dot layer from below.

FIG. 6 shows another example of a photodetector apparatus 600. In this example, the layer of conductive material 613 is opaque, but the supporting substrate 608, layer of channel material 603 and gate electrodes 604 are configured to be substantially transparent to the incident electromagnetic radiation 607 to enable exposure of the layer of quantum dot material 606 from below. For example, the substrate 608 may comprise glass or a polymer, the layer of channel material 603 may comprise graphene, and the gate electrodes 604 may comprise a transparent conductive oxide. Illuminating the layer of quantum dot material 606 from below also provides the additional benefits of photo absorption closer to the interface between the layers of quantum dot 606 and channel 603 materials (which reduces the chance of premature electron-hole recombination), and the ability to use a thicker layer of conductive material 613 for passivation/encapsulation (i.e. to prevent exposure of the underlying materials to the surrounding environment).

In some cases, the respective lateral dimensions of the layers of quantum dot 606 and conductive 613 material may be configured such that the layer of quantum dot material 606 prevents physical contact between the layer of conductive material 613 and one or more of the source 601 and drain 602 electrodes (which could create a short circuit). This may be achieved by patterning the layer of conductive material 613 so that its lateral dimensions are smaller than those of the layer of quantum dot material 606. This assumes, of course, that the layer of quantum dot material 606 has a relatively high electrical resistance and is sufficiently continuous and uniform to prevent any of the conductive material 613 from seeping through the layer of quantum dot material 606.

As mentioned above, the layer of conductive material 613 may be sufficiently transparent to the incident electromagnetic radiation 607 to enable exposure of the layer of quantum dot material 606 through the layer of conductive material 613. In general, the electromagnetic radiation 607 may comprise some or all of the electromagnetic spectrum (including one or more of visible light, infrared radiation, ultraviolet light and x-rays). However, in some examples, the user of the photodetector apparatus 600 may only be interested in a particular portion of the electromagnetic spectrum. To cater for such preferences, the layer of conductive material 613 may be configured to be substantially transparent to a predefined range of wavelengths of electromagnetic radiation 607 and substantially opaque to wavelengths outside of this predefined range. This may be achieved using a continuous layer of a particular conductive material 613 which is only transparent to the predefined range of wavelengths.

Figure 7A:
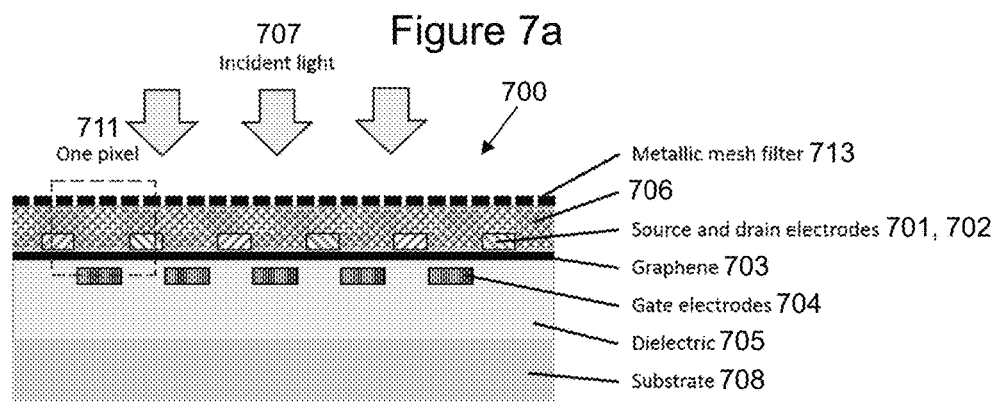
FIG. 7a shows a photodetector apparatus comprising a layer of conductive material in the form of a mesh.
Figure 7B:
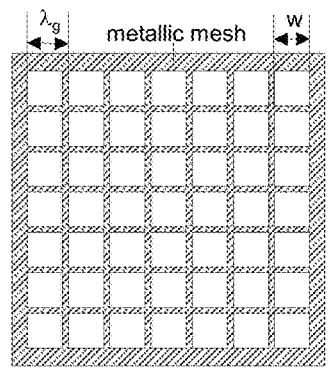
FIG. 7b shows a mesh configured to form an inductive grid.
Figure 7C:
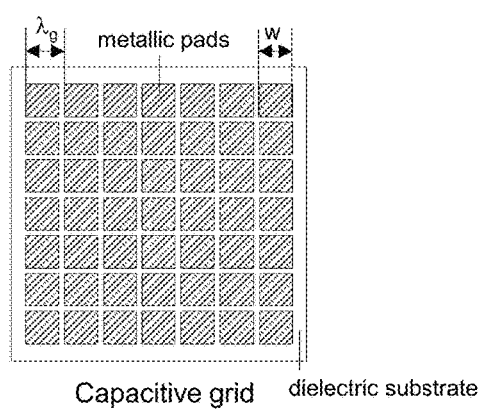
FIG. 7c shows a mesh configured to form a capacitive grid.

FIGS. 7a-c show another method of allowing only specific wavelengths of electromagnetic radiation 707 to be incident upon the layer of quantum dot material 706. In this example, the layer of conductive material 713 comprises a mesh having a periodicity $\lambda_g$ configured to define the range of wavelengths. Meshes 713 with periodicities $\lambda_g$ of the scale of the wavelength of the electromagnetic radiation 707 or smaller can act as optical filters and may be used for spectral filtering in the visible and infrared ranges. Depending on whether the mesh 713 consists of apertures in a continuous film (i.e. an inductive grid comprising apertures of width w, as shown in FIG. 7b) or free-standing islands (i.e. a capacitive grid comprising islands of width w, as shown in FIG. 7c), it may form a high-pass or low-pass filter, respectively. Variants of such structures can also be used to form resonant grids with band-pass functionality. In some cases, the photodetector apparatus 700 may comprise a mesh 713 which is separate to the layer of conductive material so as not to place any further limitations on the materials used to form the layer of conductive material.

As described previously, half of the photogenerated charge carriers are transferred from the layer of quantum dot material to the layer of conductive material. The effective gating of the layer of channel material in the present apparatus therefore does not rely on charge trapping within the layer of quantum dot material. In actual fact, it is preferred that the layer of quantum dot material contains as few charge traps and has as large a charge carrier mobility as possible. In this regard, the layer of quantum dot material may comprise an inorganic atomic passivant (e.g. chloride ions, bromide ions, iodide ions, ammonium sulphide or sodium sulphide) configured to increase its charge carrier mobility. Inorganic atomic passivants have been shown to yield quantum dot films with electron mobilities two orders of magnitude greater than equivalent films, as well as lower trap densities and shallower trap energies resulting in reduced trap lifetimes. The presence of an inorganic atomic passivant within the layer of quantum dot material may therefore serve to increase the speed of response of the photodetector apparatus. Furthermore, the diffusion coefficient is proportional to the charge carrier mobility in the quantum dot layer by Einstein's relation, so the presence of an inorganic atomic passivant may also increase the speed of recovery of the photodetector apparatus.

The quantum dots may also be combined with other light-sensitive materials (such as hybrid halide perovskites of the general formula $ABX_3$, where A is $CH_3NH_3$ or $NH_2CH\!\!=\!\!NH_2$, B is Pb or Sn, and X is Cl, Br or I) to provide stabilisation and improved charge extraction.

FIG. 8 shows another example of a photodetector apparatus 800 comprising a plurality of pixels 811. In this example, a first subset of the plurality of pixels 811 comprise a conductive material 813a having a first work function, and a second subset of the plurality of pixels 811 comprise a conductive material 813b having a second work function. The first work function material 813a may be chosen to increase the responsivity of the first subset of pixels 811 and the second work function material 813b may be chosen to increase the speed of the second subset of pixels 811. In this way, the photodetector apparatus 800 may benefit simultaneously from both aspects. In other examples, the photodetector apparatus 800 may comprise more than two subsets of pixels 811 each having a different work function.

FIG. 9 shows another example of a photodetector apparatus 900 comprising first and second subsets of pixels 911. As with the example shown in FIG. 8, each subset of pixels comprises a conductive material 913a,b having a different work function. However, in this example, the polarity of the voltages applied to the gate electrodes 904 in each subset is also different. As described in more detail below, this combination may be used to increase the output signal of the photodetector apparatus 900.

Figure 10:
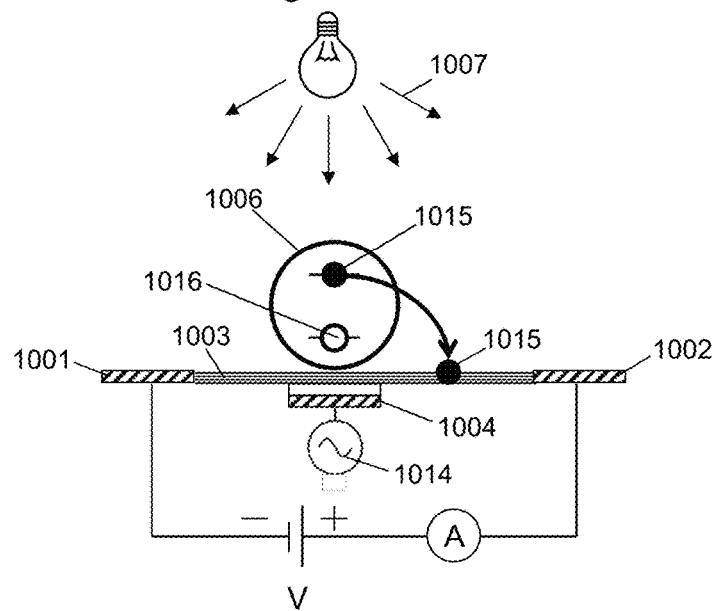
FIG. 10 shows how a gate electrode can be used to control the transfer of charge carriers from a quantum dot to the layer of channel material.

FIG. 10 shows how a gate electrode 1004 can be used to control the optoelectronic response of a quantum dot field-effect transistor. When a voltage 1014 is applied to the gate electrode 1004, an electric field is produced by the gate electrode 1004 which can (depending on its strength, e.g. up to $10^8$ V/m) change the band-alignment between the channel 1003 and the quantum dot 1006. This change in band-alignment influences whether an electron 1015 or hole 1016 of a photogenerated electron-hole pair is transferred to the channel 1003. For example, if a first voltage is applied to the gate electrode 1004, the resulting electric field may enable the transfer of an electron 1015 from the quantum dot 1006 to the channel 1003. Similarly, if a second voltage is applied to the gate electrode 1004, the resulting electric field may enable the transfer of a hole 1016 from the quantum dot 1006 to the channel 1003. Based on a typical dielectric thickness of 10-100 nm, the gate voltages may be in the range of ±1-50V.

When the channel 1003 is p-doped and the applied voltage 1014 enables the transfer of an electron 1015 from the quantum dot 1006 to the channel 1003, the remaining hole 1016 on the quantum dot 1006 creates a depletion region in the channel 1003 causing a decrease in the electrical current flowing therethrough. On the other hand, when the applied voltage 1014 enables the transfer of a hole 1016 from the quantum dot 1006 to the channel 1003, the remaining electron 1015 on the quantum dot 1006 creates a conductive region in the channel 1003 causing an increase in the electrical current flowing therethrough.

When the channel 1003 is n-doped and the applied voltage 1014 enables the transfer of an electron 1015 from the quantum dot 1006 to the channel 1003, the remaining hole 1016 on the quantum dot 1006 creates a conductive region in the channel 1003 causing an increase in the electrical current flowing therethrough. On the other hand, when the applied voltage 1014 enables the transfer of a hole 1016 from the quantum dot 1006 to the channel 1003, the remaining electron 1015 on the quantum dot 1006 creates a depletion region in the channel 1003 causing a decrease in the electrical current flowing therethrough.

Depending on its strength (e.g. $10^8$-$10^9$ V/m), the electric field generated by the gate electrode 1004 can cause electrostatic doping of the channel 1003 instead of changes in the band-alignment between the channel 1003 and the quantum dot 1006. For example, a positive gate voltage 1014 may enable the transfer of a hole 1016 from an un-doped channel 1003 to the quantum dot 1006 leaving an electron 1015 in the channel 1003 (i.e. n-doped channel), whilst a negative gate voltage 1014 may enable the transfer of an electron 1015 from an un-doped channel 1003 to the quantum dot 1006 leaving a hole 1016 in the channel 1003 (i.e. p-doped channel). In this scenario, the doping of the channel 1003 may be used to dictate whether the incident electromagnetic radiation 1007 causes an increase or decrease in the electrical current rather than the band-alignment between the channel 1003 and the quantum dot 1006. Based on a typical dielectric thickness of 10-100 nm, the gate voltages may be in the range of ±50-100V.

In the example shown in FIG. 9, the voltage applied to the gate electrode 904 of the first subset of the plurality of pixels 911 is different to the voltage applied to the gate electrode 904 of the second subset of the plurality of pixels 911 such that the majority carriers of the layer of channel material 903 of the first and second subsets are different. For those pixels 911 which are biased to be p-type, the incident electromagnetic radiation causes an increase in electrical current if the photogenerated holes are transferred to the layer of channel material 903. In contrast, for those pixels 911 which are biased to be n-type, the incident electromagnetic radiation causes a decrease in electrical current if the photogenerated holes are transferred to the layer of channel material 903. Exactly the opposite effect occurs if the photogenerated electrons are transferred to the layer of channel material 903. In effect, since the first subset of pixels 911 exhibits an opposite optoelectronic response to the second subset of pixels 911, the combined output signal of a pair of oppositely biased pixels 911 can be up to twice as large as that of a single pixel 911. In the example of FIG. 9, the pixels 911 can be optimised for both n-type and p-type by tuning their respective work functions.

In some cases, the output signal of a photodetector is passed to an analogue-to-digital converter (ADC) to enable subsequent digital signal processing. Since most ADCs require voltage mode signals, however, the current mode signal of the field-effect transistor (i.e. the change in electrical current flowing through the layer of channel material) in these cases needs to be converted into a corresponding voltage signal. This may be achieved by arranging the pixels to form a bridge circuit.

Figure 11A:
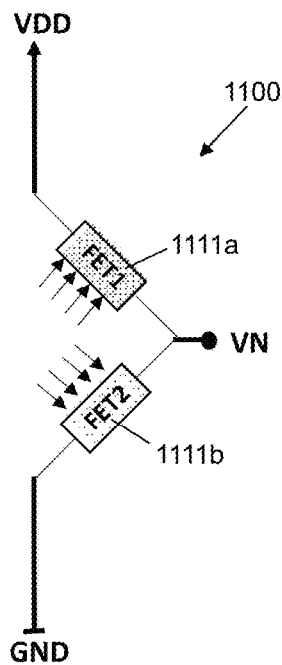
FIG. 11a shows a photodetector apparatus comprising a half-bridge circuit.

FIG. 11a shows an example of a photodetector apparatus 1100a in which one pixel 1111a from the first subset and one pixel 1111b from the second subset are arranged to form a half-bridge circuit configured to convert the change in electrical current into a single-ended voltage signal VN. In this example, the quantum dot field-effect transistors 1111a,b are connected in series between power supply VDD and ground GND terminals.

Figure 11B:
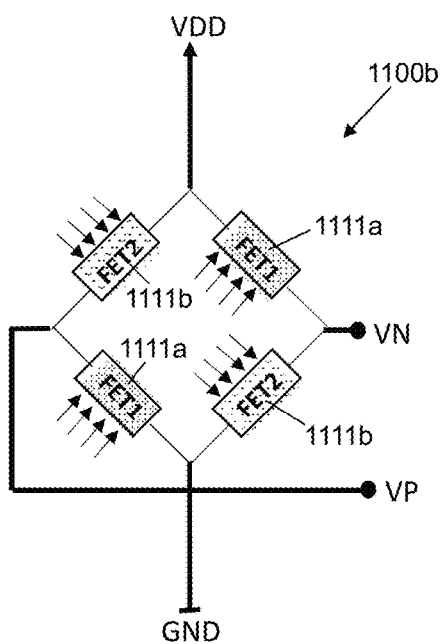
FIG. 11b shows a photodetector apparatus comprising a full-bridge circuit.

FIG. 11b shows an example of a photodetector apparatus 1100b in which two pixels 1111a from the first subset and two pixels 1111b from the second subset are arranged to form a full-bridge circuit configured to convert the change in electrical current into a differential voltage signal VN, VP. Differential signals VN, VP tend to be less sensitive to supply interference and common mode noise, which results in a greater signal-to-noise ratio. Although two pixels 1111a,b from each subset are used in this example, the full-bridge circuit could be extended to include further pixels 1111a,b. In general, the magnitude of the output signal (and therefore the gain) increases with the number of pixels 1111a,b per branch.

Figure 12:
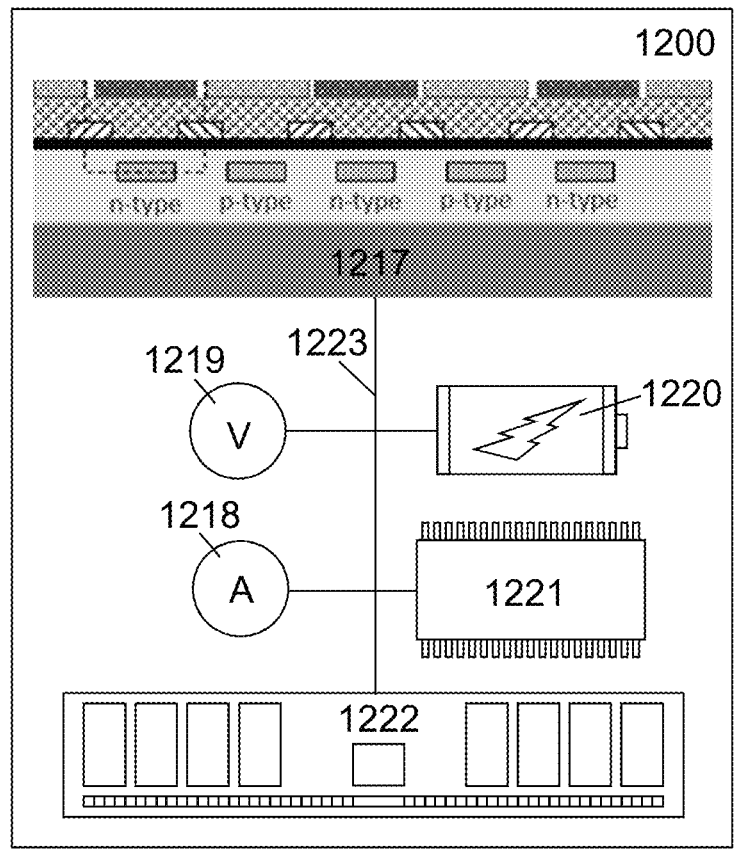
FIG. 12 shows another example of a photodetector apparatus.

FIG. 12 shows another example of a photodetector apparatus 1200. The apparatus 1200 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a photodetector, and a module for one or more of the same. In the example shown, the apparatus 1200 comprises the various components described previously (denoted collectively by reference numeral 1217), an ammeter 1218, a voltmeter 1219, a power supply 1220, a processor 1221 and a storage medium 1222, which are electrically connected to one another by a data bus 1223.

The processor 1221 is configured for general operation of the apparatus 1200 by providing signalling to, and receiving signalling from, the other components to manage their operation. The storage medium 1222 is configured to store computer code configured to perform, control or enable operation of the apparatus 1200. The storage medium 1222 may also be configured to store settings for the other components. The processor 1221 may access the storage medium 1222 to retrieve the component settings in order to manage the operation of the other components.

Under the control of the processor 1221, the power supply 1220 is configured to apply a voltage between the source and drain electrodes to enable a flow of electrical current through the layer of channel material. In addition, the power supply 1220 may be configured to apply a further voltage to the gate electrode to influence the transfer of charge carriers between the layers of quantum dot and channel material.

The ammeter 1218 is configured to measure the electrical current through the layer of channel material so that any changes in current caused by the incident electromagnetic radiation can be determined. Additionally or alternatively, the voltmeter 1219 may be configured to measure the voltage signal corresponding to the change in electrical current (i.e. when the pixels are arranged to form a bridge circuit).

Based on the change in electrical current, or the corresponding voltage signal, the processor 1221 is configured to determine one or more of the presence and magnitude of the incident electromagnetic radiation. In order to determine the presence/magnitude of the incident electromagnetic radiation, the processor 1221 may use predetermined calibration data saved in the storage medium 1222 which correlates the intensity of the electromagnetic radiation with the change in current or the corresponding voltage signal.

The processor 1221 may be a microprocessor, including an Application Specific Integrated Circuit (ASIC). The storage medium 1222 may be a temporary storage medium such as a volatile random access memory. On the other hand, the storage medium 1222 may be a permanent storage medium such as a hard disk drive, a flash memory, or a non-volatile random access memory. The power supply 1220 may comprise one or more of a mains supply, a primary battery, a secondary battery, a capacitor, a supercapacitor and a battery-capacitor hybrid.

Figure 13:
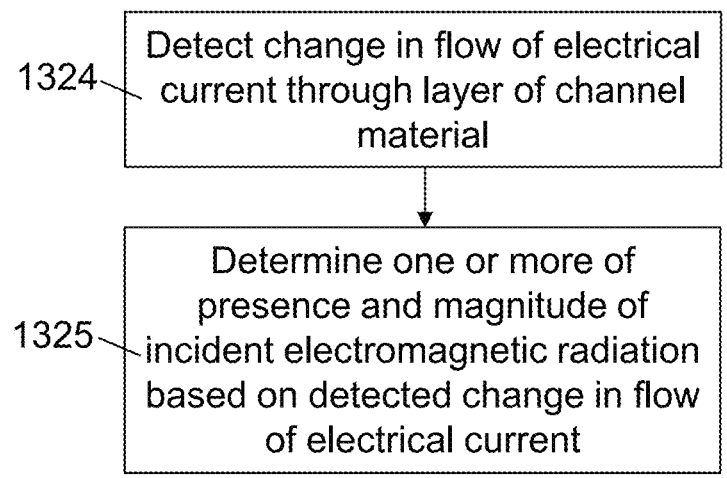
FIG. 13 shows a method of using a photodetector apparatus.

FIG. 13 shows schematically the main steps 1324-1325 of a method of using a photodetector apparatus. The method generally comprises: detecting a change in the flow of electrical current through the layer of channel material 1324; and determining one or more of the presence and magnitude of the incident electromagnetic radiation based on the detected change in the flow of electrical current 1325.

Figure 14:
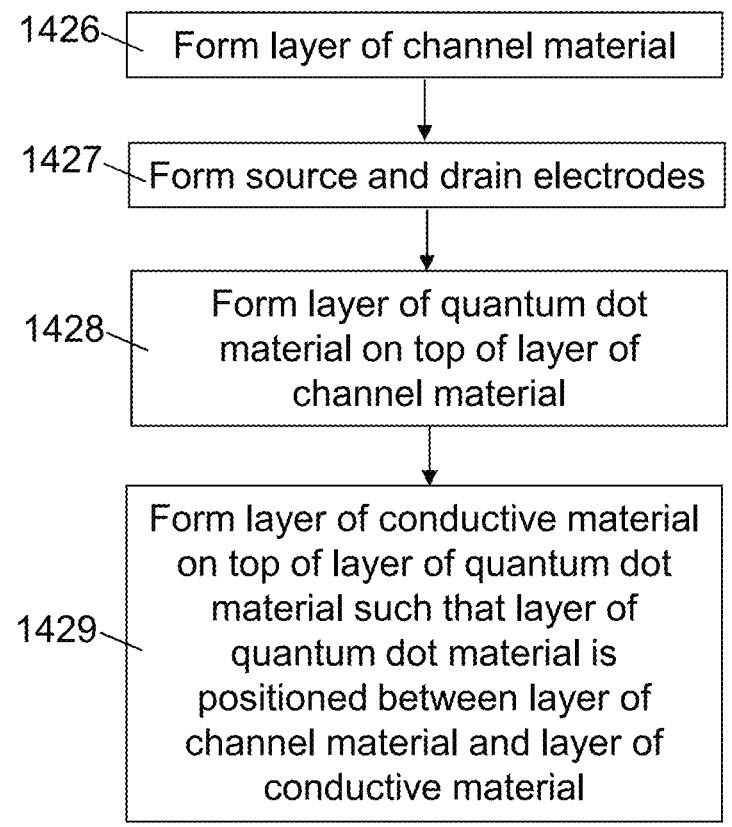
FIG. 14 shows a method of making a photodetector apparatus.

FIG. 14 shows schematically the main steps 1426-1429 of a method of making a photodetector apparatus. The method generally comprises: forming a layer of channel material 1426; forming source and drain electrodes configured to enable a flow of electrical current through the layer of channel material 1427; forming a layer of quantum dot material on top of the layer of channel material configured to generate electron-hole pairs on exposure to incident electromagnetic radiation 1428; and forming a layer of conductive material on top of the layer of quantum dot material such that the layer of quantum dot material is positioned between the layer of channel material and the layer of conductive material 1429.

Figure 15:
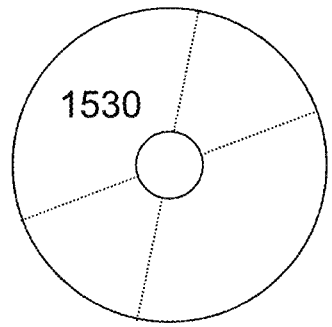
FIG. 15 shows a computer-readable medium comprising a computer program configured to perform, control or enable a method described herein.

FIG. 15 illustrates schematically a computer/processor readable medium 1530 providing a computer program according to one embodiment. The computer program may comprise computer code configured to perform, control or enable one or more of the method steps 1324-1429 of FIG. 13 or 14. In this example, the computer/processor readable medium 1530 is a disc such as a digital versatile disc (DVD) or a compact disc (CD). In other embodiments, the computer/processor readable medium 1530 may be any medium that has been programmed in such a way as to carry out an inventive function. The computer/processor readable medium 1530 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising a layer of channel material, source and drain electrodes configured to enable a flow of electrical current through the layer of channel material, and a layer of quantum dot material configured to generate electron-hole pairs on exposure to incident electromagnetic radiation to produce a detectable change in the electrical current which is indicative of one or more of the presence and magnitude of the electromagnetic radiation,
wherein the layer of quantum dot material is positioned between the layer of channel material and a layer of conductive material, and
wherein the layers of channel and conductive material have work functions such that respective built-in electric fields are created at the interfaces between the layer of quantum dot material and the layers of channel and conductive material, the built-in electric field at each interface acting in the same direction to promote separation of the electrons and holes of the generated electron-hole pairs to facilitate production of the detectable change in electrical current.

2. The apparatus of claim 1, wherein each built-in electric field extends across a depletion region of the respective interface, and wherein the layer of quantum dot material has a thickness of no more than the combined widths of the depletion regions such that an electric field is present throughout the thickness of the quantum dot layer.

3. The apparatus of claim 1, wherein the layer of conductive material is configured to be substantially transparent to the incident electromagnetic radiation to enable exposure of the layer of quantum dot material through the layer of conductive material.

4. The apparatus of claim 1, wherein the apparatus comprises a substrate configured to support the electrodes and layers of channel, quantum dot and conductive material, and wherein the substrate and layer of channel material are configured to be substantially transparent to the incident electromagnetic radiation to enable exposure of the layer of quantum dot material through the substrate and layer of channel material.

5. The apparatus of claim 1, wherein the layer of conductive material is configured to be substantially transparent to a predefined range of wavelengths of electromagnetic radiation and substantially opaque to wavelengths outside of this predefined range.

6. The apparatus of claim 5, wherein the layer of conductive material comprises a mesh having a periodicity configured to define the range of wavelengths.

7. The apparatus of claim 1, wherein the apparatus comprises a plurality of pixels each comprising respective source and drain electrodes and layers of channel, quantum dot and conductive material, and wherein a first subset of the plurality of pixels comprise a conductive material having a first work function, and a second subset of the plurality of pixels comprise a conductive material having a second work function.

8. The apparatus of claim 7, wherein each pixel comprises a gate electrode configured to generate an electric field upon the application of a voltage thereto, and wherein the voltage applied to the gate electrode of the first subset of the plurality of pixels is different to the voltage applied to the gate electrode of the second subset of the plurality of pixels such that upon exposure to the incident electromagnetic radiation, the first and second subsets produce an increase and decrease in electrical current, respectively.

9. The apparatus of claim 1, wherein the layer of quantum dot material comprises one or more of an inorganic atomic passivant and an additional light-sensitive material configured to increase the charge carrier mobility of the layer of quantum dot material.

10. The apparatus of claim 1, wherein the layer of conductive material comprises a chemical dopant configured to vary the work function of the layer of conductive material.

11. The apparatus of claim 1, wherein the apparatus comprises an interfacial material at the interface between the layers of quantum dot and conductive material configured to introduce an electric dipole to vary the work function of the layer of conductive material.

12. The apparatus of claim 1, wherein the respective lateral dimensions of the layers of quantum dot and conductive material are configured such that the layer of quantum dot material prevents physical contact between the layer of conductive material and one or more of the source and drain electrodes.

13. The apparatus of claim 1, wherein the layer of conductive material has a different work function than the layer of channel material.

14. A method of detecting incident electromagnetic radiation using an apparatus, the apparatus comprising a layer of channel material, source and drain electrodes configured to enable a flow of electrical current through the layer of channel material, and a layer of quantum dot material configured to generate electron-hole pairs on exposure to incident electromagnetic radiation to produce a detectable change in the electrical current which is indicative of one or more of the presence and magnitude of the electromagnetic radiation, wherein the layer of quantum dot material is positioned between the layer of channel material and a layer of conductive material, and wherein the layers of channel and conductive material have work functions such that respective built-in electric fields are created at the interfaces between the layer of quantum dot material and the layers of channel and conductive material, the built-in electric field at each interface acting in the same direction to promote separation of the electrons and holes of the generated electron-hole pairs to facilitate production of the detectable change in electrical current, the method comprising determining one or more of the presence and magnitude of the incident electromagnetic radiation based on a detected change in the flow of electrical current through the layer of channel material.

15. A method of making an apparatus, the method comprising:

forming a layer of channel material;

forming source and drain electrodes configured to enable a flow of electrical current through the layer of channel material;

forming a layer of quantum dot material on top of the layer of channel material configured to generate electron-hole pairs on exposure to incident electromagnetic radiation to produce a detectable change in the electrical current which is indicative of one or more of the presence and magnitude of the electromagnetic radiation; and forming a layer of conductive material on top of the layer of quantum dot material such that the layer of quantum dot material is positioned between the layer of channel material and the layer of conductive material, the layers of channel and conductive material having work functions such that respective built-in electric fields are created at the interfaces between the layer of quantum dot material and the layers of channel and conductive material, the built-in electric field at each interface acting in the same direction to promote separation of the electrons and holes of the generated electron-hole pairs to facilitate production of the detectable change in electrical current.

* * * * *